United States Patent [19]

Dietrich et al.

[11] Patent Number: 4,772,928
[45] Date of Patent: Sep. 20, 1988

[54] ELECTRIC TRANSDUCER FOR MEASURING MECHANICAL QUANTITIES

[75] Inventors: Klaus Dietrich, Stockdorf; Walter Kroy, Ottobrunn, both of Fed. Rep. of Germany

[73] Assignee: Messerschmitt-Bölkow-Blohm GmbH, Munich, Fed. Rep. of Germany

[21] Appl. No.: 855,886

[22] Filed: Apr. 24, 1986

[30] Foreign Application Priority Data

Apr. 27, 1985 [DE] Fed. Rep. of Germany ....... 3515349

[51] Int. Cl.[4] ...................... H01L 29/84; H01L 29/96
[52] U.S. Cl. .................................... 357/26; 357/23.1; 73/517 R
[58] Field of Search ................... 357/25, 26, 27, 22 B, 357/23.1; 73/517 R, 518, 718, 720, 726, 862.64, 862.68

[56] References Cited

U.S. PATENT DOCUMENTS

| | | | |
|---|---|---|---|
| 3,413,573 | 11/1968 | Nathanson et al. | 357/26 X |
| 3,533,022 | 10/1970 | Engeler et al. | 357/27 X |
| 3,585,466 | 6/1971 | Davis, Jr. et al. | 357/26 |
| 4,342,227 | 8/1982 | Petersen et al. | 73/517 R X |
| 4,480,488 | 11/1984 | Read et al. | 73/862.68 |
| 4,571,661 | 2/1986 | Hoshino | 357/26 X |
| 4,653,326 | 3/1987 | Danel et al. | 73/517 R |

FOREIGN PATENT DOCUMENTS 1088793  10/1967  United Kingdom .

OTHER PUBLICATIONS

Chen, Pau-Ling, et al., "Integrated Silicon Microbeam PI-FET Accelerometer", IEEE Tras. on Elec. Dev., vol. ED-29, No. 1, Jan. 1982, pp. 27-33.

Primary Examiner—Andrew J. James
Assistant Examiner—Sara W. Crane
Attorney, Agent, or Firm—Kenyon & Kenyon

[57] ABSTRACT

An electric transducer for measuring mechanical quantities comprises a movable tongue which is acted upon by the mechanical quantity to be measured and the deflection of which is converted into an electrical signal. The tip of the tongue may be designed as the gate and an electric conduction channel disposed opposite the tip at a small distance therefrom may comprise the source-drain path of a field effect transistor, or vice versa.

9 Claims, 1 Drawing Sheet

ELECTRIC TRANSDUCER FOR MEASURING MECHANICAL QUANTITIES

BACKGROUND OF THE INVENTION

The present invention relates to an electric transducer for measuring mechanical quantities having a movable tongue which is acted upon by the mechanical quantity to be measured and the excursion of which is converted into an electrical signal.

Transducers of this type are widely known and are described, for instance, in Christoph Rohrbach "Handbuch fuer elektrisches Messen mechanischer Groessen", VDI-Verlag Duesseldorf, 1967, under the entry "Geber". In such transducers, the mechanical quantity to be measured, for instance, the force, acts on a tongue which is usually designed as a cantilever and the excursion of which is measured either capacitively, electromagnetically, optically or in some other known manner. While such transducers can be designed to be very sensitive, they are as a rule not suitable for miniaturization.

SUMMARY OF THE INVENTION

It is therefore an object of the present invention to provide a highly sensitive transducer which can be miniaturized and, in particular, can be produced by the methods customary in semiconductor production technology. The transducer should be suitable particularly for measuring the effects of gravitational forces.

The above and other objects of the present invention are achieved by an electric transducer for measuring a mechanical quantity comprising first means comprising movable tongue means which is acted upon by the mechanical quantity to be measured and the deflection of which is converted into an electrical signal, and second means disposed opposite a tip of the tongue means at a small spacing therefrom, the second means having two incomplete field effect transistor structures on opposite sides of the second means, the tongue means and one of the incomplete transistor structures of the second means functioning as a field-effect transistor and the tongue means and the other incomplete transistor structure of the second means functioning as a second field-effect transistor.

BRIEF DESCRIPTION OF THE DRAWINGS

The invention will be explained in greater detail in the following detailed description with the aid of the embodiment shown in the drawings, in which.

DETAILED DESCRIPTION

Figure 1:
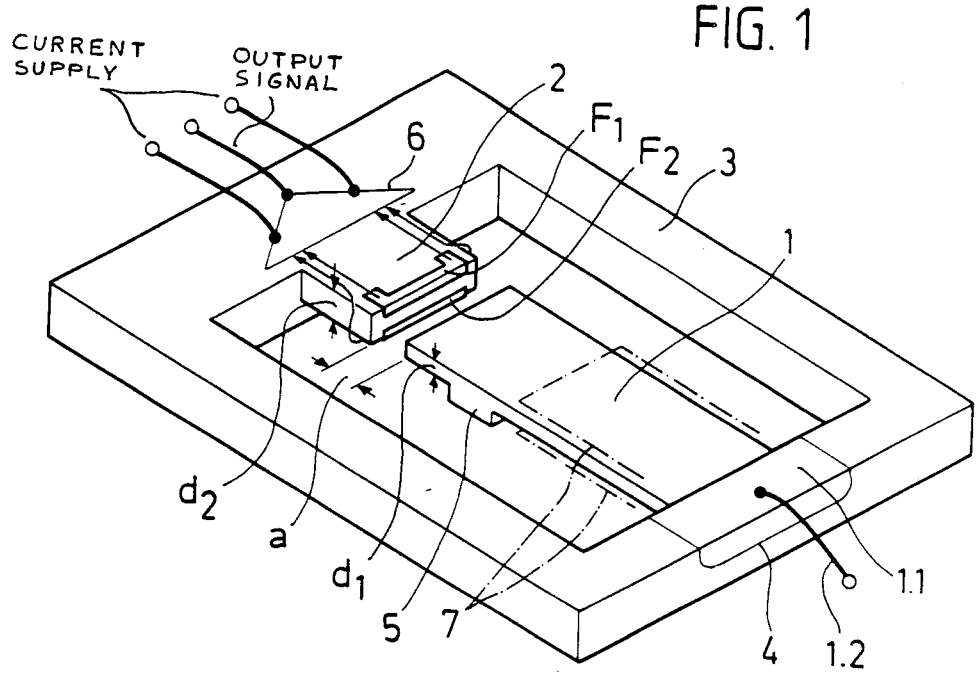
FIG. 1 shows a transducer according to the invention with a semiconductor substrate.

With reference now to the drawings, the transducer shown in FIG. 1 comprises a semiconductor substrate, for instance, silicon, in which a tongue 1, a second tongue 2 disposed opposite the tongue 1 as well as a mechanically stable yoke 3 connecting the tongues, are fabricated by methods common in semiconductor production techniques, for instance, lithography, etching techniques, doping techniques, etc. The tongue 1 has a small thickness $d_1$ in the micrometer range and is relatively long as compared to this thickness, so that it can fulfill the function of a cantilever. Furthermore, the tongue 1 has been made electrically highly conductive by doping or metallizing and is provided with an end designed as an electrode 1.1, so that an external voltage can be applied via a lead 1.2. The electrode 1.1 is separated from the rest of the substrate of the yoke 3 by a suitable bipolar barrier layer 4, so that its potential exerts no influence on the other parts of the transducer. The tongue 1 has been formed, for instance, by etching, from a platelet-shaped substrate, and a fairly large quantity 5 of the substrate material was left at the tongue 1 at a suitable point. This mass 5 serves for interaction with the gravitational force and leads to a bending of the tongue 1 upon the action of such a force or of acceleration forces.

The mass 5 may comprise, of course, also another, for instance, ferromagnetic material applied to the tongue 1 subsequently, whereby, for instance, magnetic forces can then be measured.

The second tongue 2 is relatively short as compared to the tongue 1, the thickness $d_2$ being likewise in the micrometer range. The two tongues 1 and 2 are separated by a relatively narrow gap a, which is likewise in the micrometer range. On the side of the tongue 2 opposite the tongue 1, two incomplete field effect transistor structures $F_1$ and $F_2$ insulated electrically from each other are incorporated into the substrate in the region of the upper and lower sides of tongue 2 more specifically, only the very narrow conduction channel of a source-drain path with the corresponding lead is placed on the upper and lower sides of tongue 2. The conductivity of the two FET channels $F_1$ and $F_2$ is controlled by the electric field intensity between the tongues 1 and 2. The tongue 1 thus functions as the gate for the two FET channels $F_1$ and $F_2$.

If no forces act on the tongue 1, approximately the same electric field acts on the FET channels $F_1$ and $F_2$. The thicknesses $d_1$ and $d_2$, the gap a between the tongues 1 and 2, the layout of the FET channels $F_1$ and $F_2$ as well as the electric field intensity between the tongues 1 and 2 are to be chosen so that in the rest position of the tongue 1, both "FET transistors" are at an advantageous operating point. If the tongue 1 is deflected by a force, the electric field for the two FET channels $F_1$ and $F_2$ is different and thereby also their conductivity.

Although in the embodiment shown in FIG. 1, the tip of the tongue 1 forms the gate of the FET and the conduction channels are disposed on tongue 2, the transducer could equally be arranged so that the conduction channels are disposed on tongue 1 and the gate of the FET comprises the tip of tongue 2.

Figure 2:
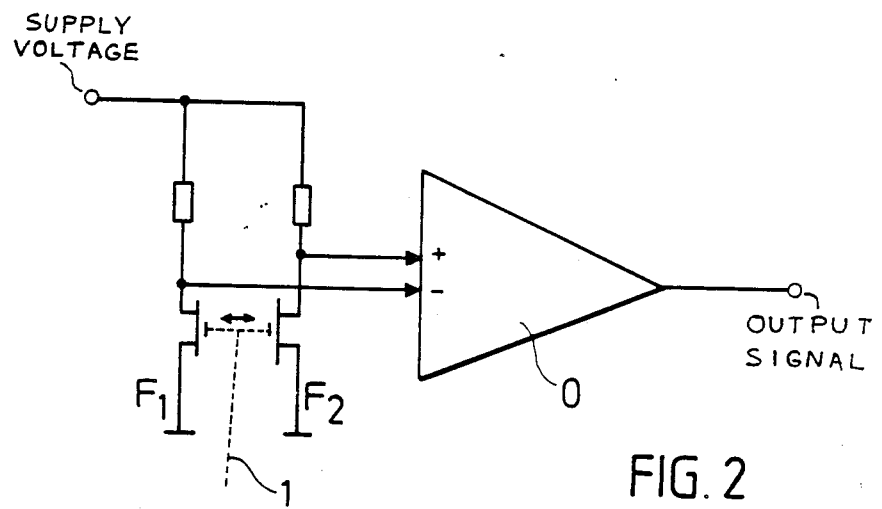
FIG. 2 shows a bridge circuit and operational amplifier for providing an output signal.

An amplifier 6 which generates an output signal from the difference of the conductivity of the two FET channels $F_1$ and $F_2$, is integrated on the substrate 3; the output signal is proportional, as far as possible, to the excursion of the tongue 1 from the rest position. For this purpose, for instance, the bridge circuit shown in FIG. 2 with an operational amplifier 0 can be used.

In many cases it may be advantageous to compensate the deflection of tongue 1 by a counterforce which can be effective in the embodiment shown in FIG. 1 by arranging a deflection electrode 7 above and below the tongue 1 at a small distance, whereby a compensating force can be generated by suitable voltage differences between the tongue 1 and these electrodes. It is thereby possible, for instance, to bring the tongue back into its rest position independently of acting gravitational forces. If the output signal of the amplifier 6 is used for controlling this compensation force, the tongue 1 is always in the rest position, independently of the acting gravitational force, and therefore at the optimum operating point of the "FET transistors". In this case, the voltage difference between the deflection electrodes 5 and the tongue 1 then forms the measurement value for the acting gravitational force. The electrodes must be shielded statically so that they have no effect on the FET channels $F_1$ and $F_2$.

The entire transducer may be arranged in a vacuum, in a gas or in an insulating liquid, whereby suitable damping values for the vibrations of the tongue 1 can be achieved.

The excursion of the tongue can be brought about, of course, not only via an external field, but can take place, for instance, directly via a pin so that thereby, small travel distance measurements are possible.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. An electric transducer for measuring a mechanical quantity comprising:
    a substrate comprising a rigid semiconductor yoke in the form of a regular parallelepiped;
    a cantilever disposed on a side of the yoke and further disposed so as to face an opposite side of the yoke, the cantilever being both capable of positive and negative motion in a direction substantially perpendicular to the plane of the yoke, the cantilever being electrically conductive;
    two partial field effect transistor structures disposed in a plane perpendicular to the plane of the cantilever on upper and lower edges of the side of the yoke opposite the cantilever, said field effect structures each comprising a source-drain path and said cantilever functioning as a common gate for each of said field effect structures;
    said cantilever moving in said direction such that when the cantilever moves toward one of said source-drain paths said cantilever moves away from the other of the source-drain paths, signals related to the distance of said cantilever from the resepective source-drain path being generated by each source-drain path.

2. The electric transducer recited in claim 1, further comprising an amplifier etched onto the yoke, the amplifier being coupled to and receiving signals from the two partial field effect transistor structures, the signals being generated by motion of the cantilever, said amplifier amplifying the difference between the signals.

3. The electric transducer recited in claim 1, wherein said field effect transistor structures are disposed on a projection extending toward the cantilever from the side of the yoke opposite the cantilever.

4. The electric transducer of claim 3, wherein the partial field effect transistors comprise two source-drain paths disposed parallel to one another and having a path length perpendicular to the deflection direction of the cantilever.

5. The electric transducer of claim 3, wherein the yoke, cantilever and projection are all disposed on the same substrate.

6. The electric transducer of claim 5, wherein the yoke, cantilever, and projection are all a part of one semiconductor substrate.

7. The electric transducer of claim 5, wherein the cantilever interacts with an external field.

8. The electric transducer of claim 2, wherein the amplifier comprises an integrated circuit means disposed on the yoke means and coupled to the partial field effect transistors.

9. The electric transducer of claim 1, wherein an electrode is placed parallel to the cantilever and generates restoring forces on the cantilever.

* * * * *